US011935467B2

(12) United States Patent
Jin

(10) Patent No.: US 11,935,467 B2
(45) Date of Patent: Mar. 19, 2024

(54) OLED DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zengjian Jin, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 436 days.

(21) Appl. No.: 17/266,362

(22) PCT Filed: Sep. 15, 2020

(86) PCT No.: PCT/CN2020/115211
§ 371 (c)(1),
(2) Date: Feb. 5, 2021

(87) PCT Pub. No.: WO2022/027784
PCT Pub. Date: Feb. 10, 2022

(65) Prior Publication Data
US 2022/0310008 A1    Sep. 29, 2022

(30) Foreign Application Priority Data

Aug. 6, 2020   (CN) .......................... 202010783952.0

(51) Int. Cl.
G09G 3/3233    (2016.01)
H10K 59/123    (2023.01)

(52) U.S. Cl.
CPC ......... *G09G 3/3233* (2013.01); *H10K 59/123* (2023.02); *G09G 2300/0408* (2013.01);
(Continued)

(58) Field of Classification Search
CPC ......... G09G 3/3233; G09G 2300/0408; G09G 2300/0426; G09G 2300/0819;
(Continued)

(56) References Cited

U.S. PATENT DOCUMENTS

| 2002/0167477 | A1  | 11/2002 | Tsutsui et al. |
| 2015/0009201 | A1* | 1/2015  | Onoyama ............ G09G 3/3233 345/212 |
| 2015/0041813 | A1* | 2/2015  | Kim .................... H01L 27/1262 438/23 |
| 2015/0145906 | A1  | 5/2015  | Naoki |

(Continued)

FOREIGN PATENT DOCUMENTS

| CN | 104347670 A | 2/2015 |
| CN | 106297672 A | 1/2017 |

(Continued)

*Primary Examiner* — Jeff Piziali

(57) ABSTRACT

An OLED display panel is provided. The OLED display panel includes a plurality of sub-pixels arranged in an array and a plurality of pixel drive circuits for driving the sub-pixels. At least one of the pixel drive circuits comprises a reset module, a data signal input module, a storage module, a light emitting device, and a drive module. The drive module drives a first light emitting device and a second light emitting device to emit light in a first display stage, and drives the first light emitting device to emit light in a second display stage, whereas the second light emitting device does not emit light.

20 Claims, 4 Drawing Sheets

(52) U.S. Cl.
CPC ............... *G09G 2300/0426* (2013.01); *G09G 2300/0819* (2013.01); *G09G 2300/0842* (2013.01); *G09G 2310/08* (2013.01); *G09G 2320/0233* (2013.01); *G09G 2320/0247* (2013.01)

(58) Field of Classification Search
CPC ....... G09G 2300/0842; G09G 2310/08; G09G 2320/0233; G09G 2320/0247; G09G 2300/0804; G09G 3/2011; G09G 3/2074; G09G 2310/0216; G09G 2320/0238; H10K 59/123
See application file for complete search history.

(56) References Cited

U.S. PATENT DOCUMENTS

| | | | |
|---|---|---|---|
| 2019/0096324 A1 | 3/2019 | Soda | |
| 2019/0340979 A1 | 11/2019 | Yang et al. | |
| 2019/0347990 A1* | 11/2019 | Knez | G09G 3/2022 |
| 2020/0193905 A1* | 6/2020 | Yoon | G09G 3/3291 |
| 2021/0158759 A1* | 5/2021 | Lin | G09G 3/3258 |
| 2023/0217763 A1* | 7/2023 | Hong | G09G 3/3258 345/55 |

FOREIGN PATENT DOCUMENTS

| | | | | |
|---|---|---|---|---|
| CN | 106782301 A | * | 5/2017 | ........... G09G 3/3208 |
| CN | 106782301 A | | 5/2017 | |
| CN | 107170408 A | | 9/2017 | |
| CN | 111224004 A | | 6/2020 | |
| CN | 111312158 A | | 6/2020 | |

* cited by examiner

OLED DISPLAY PANEL AND DISPLAY DEVICE

FIELD OF INVENTION

The present disclosure relates to the technical field of display, and particularly, to an organic light emitting diode (OLED) display panel and a display device.

BACKGROUND OF INVENTION

In a conventional organic light emitting diode (OLED) display panel, each sub-pixel is connected to a corresponding pixel drive circuit, and light emission is driven by a transistor in the pixel drive circuit. However, due to limitations of the transistor crystallization processes, the drive transistors located at different positions of the display panel often have non-uniformities in electrical parameters, such as threshold voltage and mobility. Such non-uniformities will be converted into current differences and brightness differences of OLED display devices, and are perceived by the human eyes, that is, the mura phenomenon. Especially when the drive current is very small, that is, at low gray levels, the Mura phenomenon is more serious. At present, a PWM time-sharing driving method is mainly used to reduce the brightness of the sub-pixels to improve Mura, but this method may cause the screen to flicker, and the improvement effect is insufficient.

Therefore, the conventional OLED display panel has technical problems of uneven brightness and screen flickers at low gray levels, which is needed to be improved.

SUMMARY OF INVENTION

Technical Problems

The purpose of present disclosure is to provide an organic light emitting diode (OLED) display panel in view of the problems existing in the prior art, which may improve the uneven brightness problem and the screen flicker problem in low-brightness display situations, thereby enhancing the display performance of the display panel.

Technical Solutions

To achieve the purpose described above, the present disclosure provides an OLED display panel. The OLED display panel comprises a plurality of sub-pixels arranged in an array and a plurality of pixel drive circuits for driving the sub-pixels. At least one of the pixel drive circuits comprises:
  a reset module configured to reset a potential at a first point under control of a first scan signal;
  a data signal input module connected to the reset module through the first point, and configured to input a data signal to the first point under control of a second scan signal;
  a storage module connected to the data signal input module through the first point, connected to a power high-potential signal line through a second point, and configured to store a voltage of the data signal;
  a light emitting device comprising a first light emitting device and a second light emitting device;
  a drive module, wherein a first input end of the drive module is connected to the power high-potential signal line, a second input end of the drive module is connected to the first point, and a third input end of the drive module is connected to the data signal input module through a third point, a fourth input end of the drive module is connected to the data signal input module through a fourth point, and an output end of the drive module is connected to the light emitting device, and is configured to drive the first light emitting device and the second light emitting device to emit light in a first display stage under control of a first light emitting control signal, a second light emitting control signal, and a first point potential, and to drive the first light emitting device to emit light, but not to drive the second light emitting device to emit light in a second display stage.

In one embodiment, the reset module comprises a first transistor. A gate of the first transistor is connected to the first scan signal, a first electrode of the first transistor is connected to an initialization voltage line, and a second electrode of the first transistor is connected to the first point.

In one embodiment, the data signal input module comprises a second transistor and a third transistor. A gate of the second transistor and a gate of the third transistor are connected to the second scan signal, a first electrode of the second transistor is connected to the data signal, a second electrode of the second transistor is connected to the drive module through the third point, a first electrode of the third transistor is connected to the drive module through the fourth point, and a second electrode of the third transistor is connected to the first point.

In one embodiment, the storage module comprises a storage capacitor. A first plate of the storage capacitor is connected to the first point, and a second plate of the storage capacitor is connected to the power high-potential signal line.

In one embodiment, the drive module comprises a fourth transistor, a fifth transistor, a sixth transistor, and a seventh transistor. A gate of the fourth transistor is connected to the first light emitting control signal, a first electrode of the fourth transistor is connected to the power high-potential signal line, and a second electrode of the fourth transistor and a first electrode of the fifth transistor are connected to the third point. A gate of the fifth transistor is connected to the first point, a second electrode of the fifth transistor and a first electrode of the sixth transistor and a first electrode of the seventh transistor are connected to the fourth point. A gate of the sixth transistor is connected to the first light emitting control signal, a gate of the seventh transistor is connected to the second light emitting control signal, a second electrode of the sixth transistor is connected to the first light emitting device, and a second electrode of the seventh transistor is connected to the second light emitting device.

In one embodiment, a common electrode of the first light emitting device and a common electrode of the second light emitting device are connected to a power low-potential signal line, a first sub-pixel electrode of the first light emitting device is connected to the second electrode of the sixth transistor, and a second sub-pixel electrode of the second light emitting device is connected to the second electrode of the seventh transistor.

In one embodiment, the light emitting device is an organic light emitting diode.

In one embodiment, the OLED display panel comprises:
  a substrate;
  a transistor layer formed on one side of the substrate and corresponding to at least one of the sub-pixels, wherein the transistor layer comprises the sixth transistor and the seventh transistor;

a pixel electrode layer formed on one side of the transistor layer away from the substrate, and patterned to form a plurality of pixel electrodes;

a pixel definition layer formed on one side of the transistor layer away from the substrate, and patterned to form a plurality of opening areas, wherein the opening areas has one-to-one correspondence to the pixel electrodes;

a light emitting layer formed in each of the opening areas;

a common electrode layer formed on one side of the light emitting layer away from the pixel electrode layer;

wherein in at least one of the opening areas, the pixel electrode comprises the first sub-pixel electrode and the second sub-pixel electrode that are not in contact with each other, and the first sub-pixel electrode and the second sub-pixel electrode are respectively connected to the sixth transistor and the seventh transistor.

In one embodiment, in a direction away from the substrate, the transistor layer comprises an active layer, a first gate insulation layer, a first metal layer, a second gate insulation layer, a second metal layer, an interlayer dielectric layer, a source-drain layer, and a planarization layer. The active layer is patterned to form a first active layer of the sixth transistor and a second active layer of the seventh transistor. The first metal layer is patterned to form the gate of the sixth transistor and the gate of the seventh transistor. The source-drain layer is patterned to form the first electrode and the second electrode of the sixth transistor and the first electrode and the second electrode of the seventh transistor. The second electrode of the sixth transistor is connected to the first sub-pixel electrode, and the second electrode of the seventh transistor is connected to the second sub-pixel electrode.

In one embodiment, a first doped area of the first active layer and a first doped area of the second active layer are connected to each other to form a co-doped area. The first electrode of the sixth transistor and the first electrode of the seventh transistor are connected to each other to form a common electrode. The second electrode of the sixth transistor is connected to a second doped area of the first active layer. The second electrode of the seventh transistor is connected to a second doped area of the second active layer. The common electrode is connected to the co-doped area.

In one embodiment, one of the first sub-pixel electrode and the second sub-pixel electrode is located in the middle of the opening area, and the other is disposed around the middle of the opening area.

In one embodiment, a shape of the sub-pixel electrode in the middle of the opening area is at least one of a circle, a rectangle, a triangle, and a diamond.

In one embodiment, the first sub-pixel electrode is located near one lateral side of the opening area, and the second sub-pixel electrode is located near the other lateral side of the opening area.

In one embodiment, a boundary line between the first sub-pixel electrode and the second sub-pixel electrode is at least one of a straight line, a curved line, and a polyline.

In one embodiment, a gap between the first sub-pixel electrode and the second sub-pixel electrode is filled with the same material as the planarization layer or the interlayer dielectric layer.

The present disclosure further provides a display device. The display device comprises an OLED display panel and a drive chip. The OLED display panel comprises a plurality of sub-pixels arranged in an array and a plurality of pixel drive circuits for driving the sub-pixels. At least one of the pixel drive circuits comprises:

a reset module configured to reset a potential at a first point under control of a first scan signal;

a data signal input module connected to the reset module through the first point, and configured to input a data signal to the first point under control of a second scan signal;

a storage module connected to the data signal input module through the first point, connected to a power high-potential signal line through a second point, and configured to store a voltage of the data signal;

a light emitting device comprising a first light emitting device and a second light emitting device;

a drive module, wherein a first input end of the drive module is connected to the power high-potential signal line, a second input end of the drive module is connected to the first point, a third input end of the drive module is connected to the data signal input module through a third point, and a fourth input end of the drive module is connected to the data signal input module through a fourth point. An output end of the drive module is connected to the light emitting device, and is configured to drive the first light emitting device and the second light emitting device to emit light in a first display stage under control of a first light emitting control signal, a second light emitting control signal, and a first point potential, and to drive the first light emitting device to emit light, but not to drive the second light emitting device to emit light in a second display stage.

In one embodiment, the OLED display panel comprises:

a substrate;

a transistor layer formed on one side of the substrate and corresponding to at least one of the sub-pixels, wherein the transistor layer comprises the sixth transistor and the seventh transistor;

a pixel electrode layer formed on one side of the transistor layer away from the substrate, and patterned to form a plurality of pixel electrodes;

a pixel definition layer formed on one side of the transistor layer away from the substrate, and patterned to form a plurality of opening areas, wherein the opening areas has one-to-one correspondence to the pixel electrodes;

a light emitting layer formed in each of the opening areas;

a common electrode layer formed on one side of the light emitting layer away from the pixel electrode layer;

wherein in at least one of the opening areas, the pixel electrode comprises the first sub-pixel electrode and the second sub-pixel electrode that are not in contact with each other, and the first sub-pixel electrode and the second sub-pixel electrode are respectively connected to the sixth transistor and the seventh transistor.

In one embodiment, one of the first sub-pixel electrode and the second sub-pixel electrode is located in the middle of the opening area, and the other is disposed around the middle of the opening area.

In one embodiment, a shape of the sub-pixel electrode in the middle of the opening area is at least one of a circle, a rectangle, a triangle, and a diamond.

In one embodiment, the first sub-pixel electrode is located near one lateral side of the opening area, and the second sub-pixel electrode is located near the other lateral side of the opening area.

Beneficial Effects

The beneficial effects of the present disclosure are that: the present disclosure divides the pixel electrode in the OLED display panel into two sub-pixel electrodes, and combines the time-sharing driving method, so that the organic light emitting materials in the two sub-pixel areas may optionally emit light for the different situations of normal brightness display and low brightness display, so as to avoid the problem of uneven brightness caused by the use of small current and the problem of screen flickers caused by time-sharing driving. Therefore, the OLED display panel according to the embodiments of the present disclosure may improve the problems of uneven brightness and screen flickers, thereby enhancing display quality.

BRIEF DESCRIPTION OF DRAWINGS

In order to describe the technical solution of the present disclosure more clearly, the following briefly describes the drawings required to describe the embodiments.

DETAILED DESCRIPTION OF PREFERRED EMBODIMENTS

The specific embodiments of the present disclosure will be described in detail below with reference to the accompanying drawings. Those skilled in the art should understand that the following embodiments described with reference to the accompanying drawings are exemplary and are only used to understand the present disclosure and are not intended to limit the present disclosure. In the following, the same reference signs always refer to the same or similar elements. In addition, terms such as "first", "second", etc. are only used to distinguish one component from another component, and do not limit the component to the above-mentioned terms.

Figure 1:
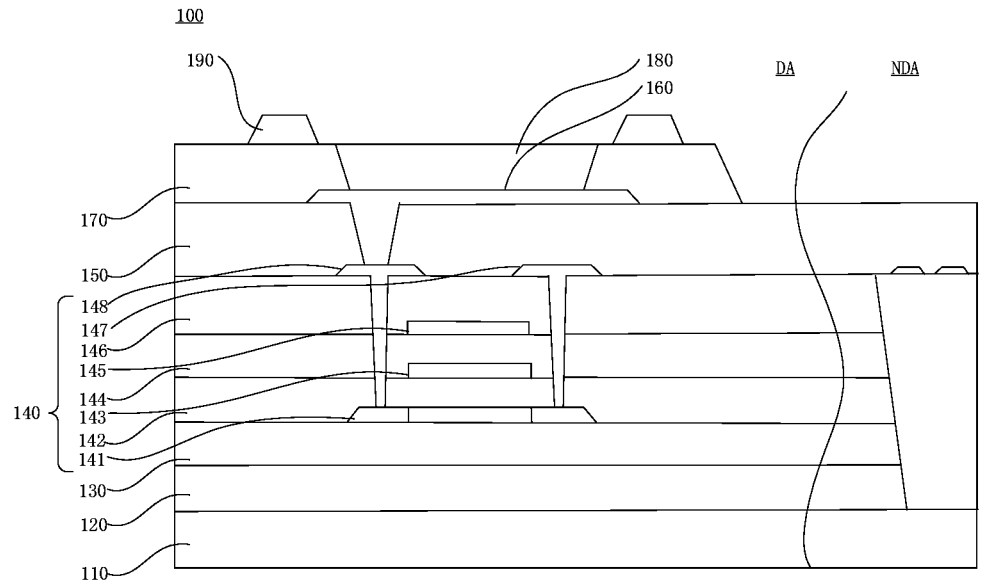
FIG. 1 is a schematic sectional view of a conventional display device.

Organic light emitting diode (OLED) display panels are increasingly used in high-performance display devices such as mobile phones and smart wearable apparatus due to their advantages of high contrast, light weight, and flexibility. FIG. 1 shows a schematic sectional view of a conventional display panel. As shown in FIG. 1, the display panel 100 comprises a display area DA and a non-display area NDA. In the display area DA, the display device 100 comprises a substrate 110, a barrier layer 120, a buffer layer 130, a transistor layer 140, a planarization layer 150, a pixel electrode 160, a pixel definition layer 170, a light emitting layer 180, and a photoresist layer 190, which are sequentially stacked. The transistor layer 140 may further comprises an active layer 141 disposed on the buffer layer 130, a first gate insulation layer 142 disposed on the active layer 141, and a first metal layer 143 formed on the first gate insulation layer 142, a second gate insulation layer 144 covering the first metal layer 143, the second metal layer 145 located above the second gate insulating layer 144, a source-drain layer located on the interlayer dielectric layer 146 and covered by the planarization layer 150. The source-drain layer comprises a first electrode 147 and a second electrode 148, which are connected to the active layer 141 respectively through a via hole penetrating the interlayer dielectric layer 146 and a via hole penetrating the gate insulation layer 142 and 144. The pixel electrode 160 is connected to the second electrode 148 through a via hole penetrating the planarization layer 150. When the display panel shown in FIG. 1 is being used to display an image, an external data signal is transmitted to the second electrode 148 via the first electrode 147, and the electrical signal is transmitted to the pixel electrode 160 electrically connected to the second electrode 148 via the second electrode 148, thereby exciting the light emission layer 180 to emit light. However, due to the non-uniformity of the electrical parameters of the transistor, OLED display devices may have current difference and brightness difference, especially when the drive current is very small, that is, at low gray levels, and such difference is more apparent. The exemplary embodiment of the present disclosure improves this phenomenon by dividing the pixel electrode into two sub-pixel electrodes in combination with a time-sharing driving method.

Figure 2:
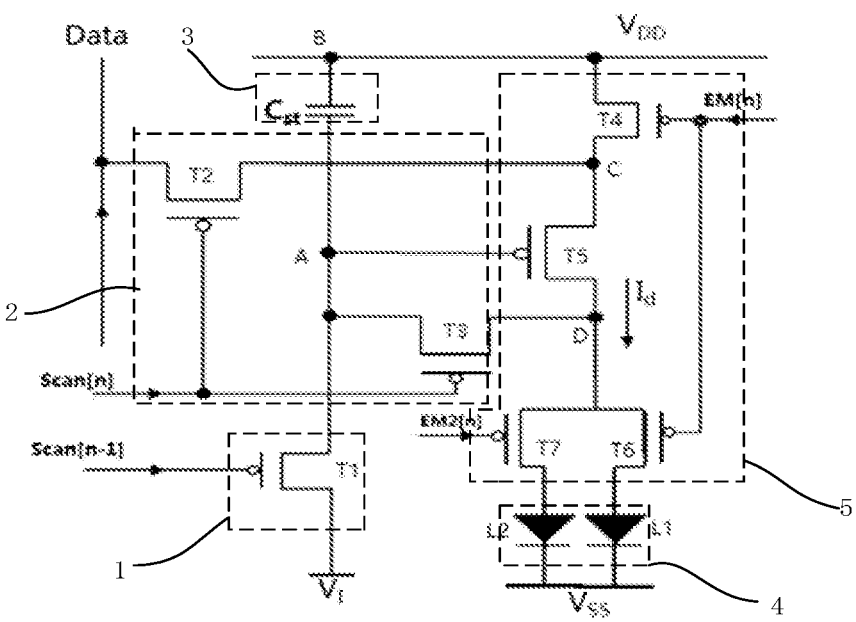
FIG. 2 shows a pixel drive circuit diagram of an organic light emitting diode (OLED) display panel according to one embodiment of the present disclosure.

As known to those skilled in the art, an OLED display panel generally comprises a plurality of sub-pixels arranged in an array and a pixel drive circuit for driving the sub-pixels. FIG. 2 shows a pixel drive circuit diagram of the OLED display panel according to one embodiment of the present disclosure. The pixel drive circuit may comprise a reset module 1, a data signal input module 2, a storage module 3, a light emitting device 4, and a drive module 5.

As shown in FIG. 2, the reset module 1 receives a first scan signal Scan[n−1], and is connected to an initialization voltage line VI and a first point A, which is configured to reset a potential at the first point A under control of the first scan signal Scan[n−1].

The data signal input module 2 is connected to the reset module 1 through the first point A. The data signal input module 2 receives a second scan signal Scan[n] and a data signal Data and inputs a data signal Data to the first point A under control of the second scan signal Scan[n].

The storage module 3 is connected between the first point A and a second point B, is connected to the data signal input module through the first point A, and is connected to the power high-potential signal line VDD (or be referred to the first power potential signal line VDD) through the second point B to store a voltage of the data signal Data.

The light emitting device 4 comprises a first light emitting device L1 and a second light emitting device L2.

A first input end of the drive module 5 and a first input end of the drive module 4 are connected to the power high-potential signal line VDD. A second input end of the drive module 5 is connected to the first point A. A third input end is connected of the drive module 5 to the data signal input module 2 through a third point C. A fourth input end of the drive module is connected to the data signal input module 2 through a fourth point D. An output end of the drive module 5 is connected to a light emitting device 5. The drive module 5 drives the first light emitting device L1 and the second light emitting device L2 to emit light in a first display stage under control of a first light emitting control signal EM1[n], a second light emitting control signal EM2[n] and the potential at the first point A, and to drive the first light emitting device L1 to emit light, but not to drive the second light emitting device L2 to emit light in a second display stage.

Specifically, as shown in FIG. 2, the reset module 1 comprises a first transistor T1. A gate of the first transistor T1 is connected to the first scan signal Scan[n−1], a first electrode of the first transistor T1 is connected to an initialization voltage, and the second electrode is connected to the first point A.

The data signal input module 2 comprises a second transistor T2 and a third transistor T3. A gate of the second transistor T2 and a gate of the third transistor T3 are connected to the second scan signal Scan[n], a first electrode of the second transistor T2 is connected to the data signal Data, and a second electrode of the second transistor T2 is connected to the drive module 5 through the third point C. A first electrode of the third transistor T3 is connected to the drive module 5 through the fourth point D, and a second electrode of the third transistor T3 is connected to the first point A.

The storage module 3 comprises a storage capacitor. A first plate of the storage capacitor is connected to the first point A, and a second plate of the storage capacitor is connected to the power high-potential signal line VDD.

The drive module 5 comprises a fourth transistor T4, a fifth transistor T5, a sixth transistor T6, and a seventh transistor T7. A gate of the fourth transistor T4 is connected to the first light emitting control signal EM1[n]. A first electrode of the fourth transistor T4 is connected to the power high-potential signal line VDD. A second electrode of the fourth transistor T4 and a first electrode of the fifth transistor T5 is connected to the third point C. A gate of the fifth transistor T5 is connected to the first point A. A second electrode of the fifth transistor T5 and a first electrode of the sixth transistor T6, a first electrode of the seventh transistor T7 are connected to the fourth point D. A gate of the sixth transistor T6 is connected to the first light emitting control signal EM1[n]. A gate of the seventh transistor T7 is connected to the second light emitting control signal EM2[n]. A second electrode of the sixth transistor T6 is connected to the first light emitting device L1, and a second electrode of the seventh transistor T7 is connected to the second light emitting device L2.

A common electrode of the first light emitting device L1 and a common electrode of the second light emitting device L2 in the light emitting device 4 are connected to the power low-potential signal line VSS (or be referred to the second power potential signal line VSS). A first sub-pixel electrode of the first light emitting device L1 is connected to the second electrode of the sixth transistor T6. A second sub-pixel electrode of the second light emitting device L2 is connected to the second electrode of the seventh transistor T7.

In one exemplary embodiment of the present disclosure, the first light emitting device L1 and the second light emitting device L2 may be organic light emitting diodes.

In the present disclosure, one of the first electrode and the second electrode of each transistor is the source and the other is the drain.

The driving method of the pixel circuit according to the embodiment of the present disclosure will be described below with reference to FIG. 3 and FIG. 4.

Figure 3:
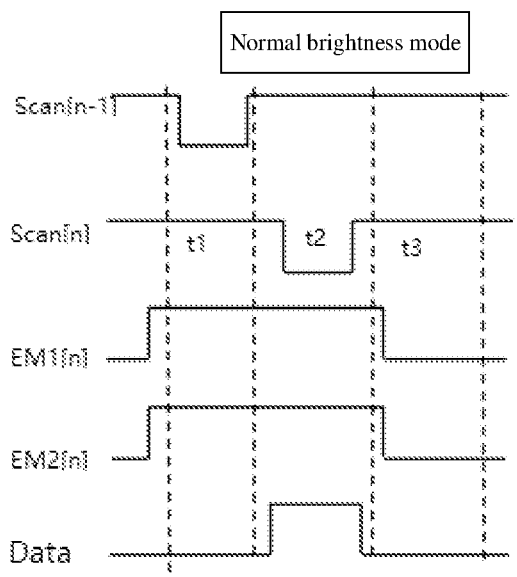
FIG. 3 shows a timing diagram of pixel drive in a normal brightness mode.

FIG. 3 shows a timing diagram of pixel drive in a normal brightness mode. FIG. 4 shows a timing diagram of pixel drive in a low brightness mode. In the present disclosure, the first display stage is the normal brightness mode, and the second display stage is the low brightness mode.

First, in FIG. 3, during a first period t1 of a driving cycle, the first scan signal Scan[n−1] is the conduction level. The first transistor T1 is turned on. A gate electrode of the fifth transistor T5 is connected to the initialization voltage line VI through the first transistor T1, and the initialization voltage is applied to the gate electrode of the fifth transistor T5 and a second electrode of the storage capacitor. As such, the charges stored in the storage capacitor is initialized.

During a second period t2, the second scan signal Scan[n] is the conduction level. The second transistor T2 and the third transistor T3 are turned on. A data voltage Data is written into the storage capacitor through the turn-on second transistor T2, the fifth transistor T5, and the third transistor T3.

During a subsequent third period t3, the light emitting control signals EM1[n] and EM2[n] are the conduction levels. The fourth transistor T4, the sixth transistor T6, and the seventh transistor T7 are turned on. Therefore, the power high-potential signal line VDD, the fourth transistor T4, the fifth transistor T5, the sixth transistor T6, the first light emitting device L1, and the power low-potential signal line VSS form a driving current path, and the first light emitting device L1 emits light. Similarly, the power high-potential signal line VDD, the fourth transistor T4, the fifth transistor T5, the seventh transistor T7, the second light emitting device L2, and the power low-potential signal line VSS form a driving current path, and the second light emitting device L2 emits light.

Figure 4:
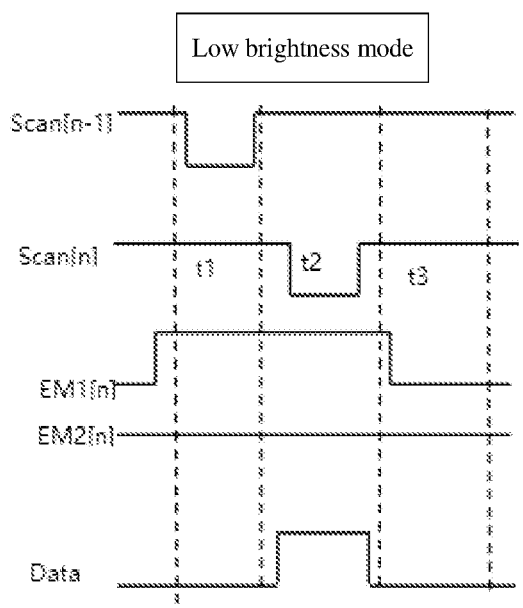
FIG. 4 shows a timing diagram of pixel drive in a low brightness mode.

FIG. 4 shows the timing control diagram of pixel drive in a low brightness mode. Compared with the timing control diagram of FIG. 3, in FIG. 4, the second light emitting control signal EM2[n] is always at a high level. Therefore, the seventh transistor T7 is always in a non-conducting state in the low brightness mode. Thus, the second light emitting device L2 does not emit light in the low brightness mode. The driving light emitting mode of the first light emitting device L1 is the same as the normal brightness mode.

Specifically, during the first period t1, the first scan signal Scan[n−1] is the conduction level. The first transistor T1 is turned on. The initialization voltage is applied to the second electrode of the storage capacitor. The charges stored in the capacitor is initialized. During the second period t2, the second scan signal Scan[n] is the conduction level. The second transistor T2 and the third transistor T3 are turned on. The data voltage Data are written into the storage capacitor through the second transistor T2, the fifth transistor T5, and the third transistor T3. During the third period t3, the first light emitting control signal EM1[n] is turned on, and the fourth transistor T4 and the sixth transistor T6 are turned on. A light emitting device L1 emits light. However, the second light emitting control signal EM2[n] is always at a high level in the low brightness mode, and the seventh transistor T7 is turned off. Therefore, the second light emitting device L2 does not emit light in the low brightness mode.

It may be seen that, in the embodiments of the present disclosure, in different brightness modes, optionally driving different light emitting devices to emit light may avoid the problem of uneven brightness caused by the use of small current and the problem of screen flickers caused by time-sharing driving. Therefore, the pixel unit according to the embodiment of the present disclosure may improve the problems of uneven brightness and screen flickers, thereby enhancing display quality.

Figures 5, 6A:
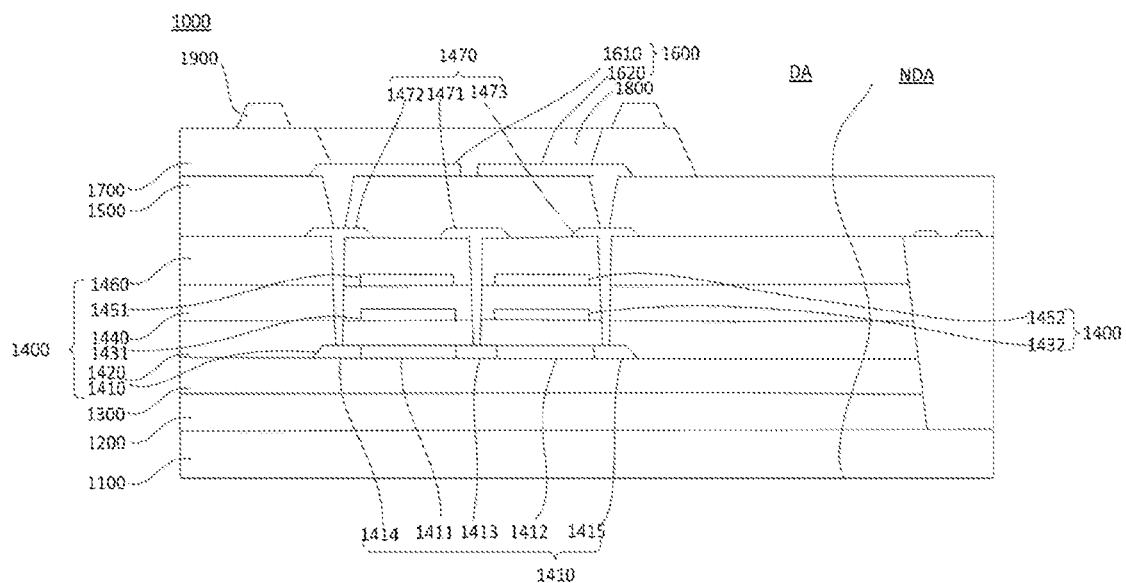
FIG. 5 shows a schematic sectional view of a display panel according to one embodiment of the present disclosure.
FIG. 6A to FIG. 6C respectively show an example of a planar structure of a pixel unit according to one embodiment of the present disclosure.
Figure 6B:
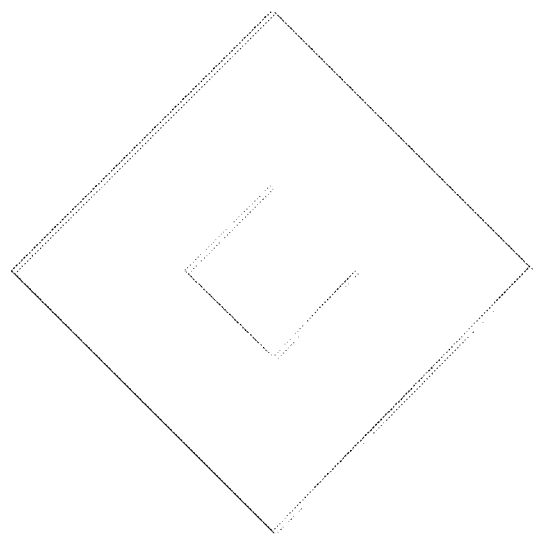
Figure 6C:
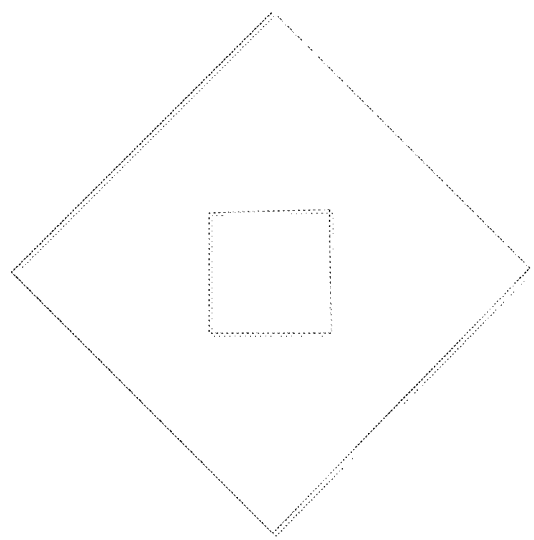

The structure of the display panel comprising the above-mentioned pixel structure will be described below with reference to FIG. 5. FIG. 5 shows a schematic sectional view of the display panel according to one embodiment of the present disclosure. FIG. 6A to FIG. 6C respectively show an example of a planar structure of the pixel unit according to one embodiment of the present disclosure.

As shown in FIG. 5, the display panel 1000 comprises a display area DA and a peripheral area PA surrounding the display area DA. The display area DA comprises a plurality of pixels arranged in an array. The peripheral area PA comprises various conductive lines and connectors for transmitting electrical signals. The conductive lines and the connectors are connected to the pixel to transmit electric signals to the pixels, thereby displaying an image in the display area DA.

In the embodiment of the present disclosure, the plurality of pixels may constitute one pixel unit. One pixel unit may comprises a plurality of pixels that emit light with different colors, such as a red pixel that emits red light, a blue pixel that emits blue light, and a green pixel that emits green light. For example, the pixel unit may comprise one red pixel, one blue pixel, and two green pixels arranged in a 2*2 array. However, the present disclosure is not limited thereto. The number, weight, and arrangement of pixels included in the pixel unit may be configured according to actual requirements. Hereinafter, a specific arrangement of a single pixel will be described in detail with reference to FIG. 5.

Referring to FIG. 5, in the display area DA, the display device 1000 may comprises: a substrate 1100, a transistor layer 1400 formed on one side of the substrate, a pixel electrode layer 1600 formed on the side of the transistor layer 1400 away from the substrate, a pixel definition layer 1700 formed on one side of the pixel electrode layer 1600 away from the substrate, and a light emitting layer 1800 formed in the opening of the pixel definition layer. Although not shown in FIG. 5, a common electrode layer may also be formed on one side of the light emitting layer 1800 away from the pixel electrode layer.

The substrate 1100 may be a flexible substrate made of, for example, a flexible base material (PI). Optionally, the substrate 1100 may also be a two-layer structure made of two layers of PI. In one exemplary embodiment, a barrier layer 1200 and a buffer layer 1300 located on the barrier layer 1200 may further be disposed on the substrate 1100 to prevent foreign impurities from invading the display element and affecting the normal use of the display device.

Referring to FIG. 5, the transistor layer 1400 corresponds to at least one sub-pixel, and FIG. 5 exemplarily shows that the transistor layer 1400 comprises a sixth transistor T6 and a seventh transistor T7.

The transistor layer 1400 may comprise an active layer 1410. The active layer 1410 is disposed on the buffer layer 1300. The active layer 1410 may be patterned to form a first active layer of the sixth transistor T6 and a second active layer of the seventh transistor T7. Moreover, a first doped area of the first active layer and a first doped area of the second active layer are connected to each other to form a co-doped area. As specifically shown in FIG. 5, the active layer 1410 may comprise two channel areas, a first channel area 1411, and a second channel area 1412. A common source area 1413 is formed between the first channel area 1411 and the second channel area 1412. A first drain area 1414 is formed at the other end of the first channel area 1411. Similarly, a second drain area 1415 is formed at the other end of the second channel area 1412.

A first gate insulation layer 1420 is formed on the active layer 1410. A first metal layer is formed on the first gate insulation layer 1420, and the first metal layer may be patterned to form the gate of the sixth transistor T6 and the gate of the seventh transistor T7. As shown in FIG. 5, a first gate electrode 1431 and a second gate electrode 1432 are respectively formed at positions corresponding to the first channel area 1411 and the second channel area 1412.

Optionally, in some embodiments of the present disclosure, a double-gate structure may also be used. Specifically, as shown in FIG. 2, a second gate insulation layer 1440 may also be formed on the first gate electrode 1431 and the second gate electrode 1432. A patterned second metal layer is formed thereon. Specifically, at positions corresponding to the first gate electrode 1431 and the second gate electrode 1432, a first additional gate electrode 1451 and a second additional gate electrode 1452 may be formed respectively. However, the present disclosure is not limited thereto. Those skilled in the art may choose the single-gate structure or the double-gate structure described above based on the requirements.

An interlayer dielectric layer 1460 is formed on the gate structure. When a single gate structure is used, the interlayer dielectric layer 1460 is formed on the first gate electrode 1431 and the second gate electrode 1432. When the double-gate structure is used, as shown in FIG. 5, the interlayer dielectric layer 1460 covers the first additional gate electrode 1451 and the second additional gate electrode 1452.

A source-drain layer 1470 is formed on the interlayer dielectric layer 1460 and is covered by a planarization layer 1500. The source-drain layer 1470 may be patterned to form the first electrode and the second electrode of the sixth transistor T6, and the first electrode and the second electrode of the seventh transistor T7. Moreover, the first electrode of the sixth transistor T6 and the first electrode the seventh transistor T7 may be shared. As shown in FIG. 5, the source-drain layer 1470 may comprise a source electrode 1471, a first drain electrode 1472, and a second drain electrode 1473, which respectively correspond and connect to the common source area 1413, the first drain area 1414, and the second drain area 1415 of the active area 1410 through via holes of the interlayer dielectric layer 1460, the second gate insulation layer 1440, and the first gate insulation layer 1420.

The pixel electrode layer 1600 may comprise a plurality of patterned pixel electrodes. The pixel definition layer 1700 is formed on one side of the pixel electrode layer 1600 away from the substrate and is patterned to form a plurality of opening areas corresponding to the pixel electrodes. FIG. 5 exemplarily shows one open area. As shown in FIG. 5, the pixel electrode 1600 comprise a first sub-pixel electrode 1610 and a second sub-pixel electrode 1620 that are not in contact with each other, and the first sub-pixel electrode 1610 and the second sub-pixel electrode 1620 are respectively connected to the first drain electrode 1472 and the second drain electrode 1473 below the planarization layer 1500 by penetrating via holes of the planarization layer 1500.

In one exemplary embodiment, in order to planarization the hierarchical structure of the display device and reduce the impact of the cutoff on the display performance, a gap between the first sub-pixel electrode 1610 and the second sub-pixel electrode 1620 may be filled with the same material as the planarization layer or the interlayer dielectric layer.

In one exemplary embodiment, a barrier 1900 may be formed on the pixel definition layer 1700 to further enhance display performance.

FIG. 6A to FIG. 6C further show specific examples in which the pixel electrode is divided.

For example, in FIG. 6A, the pixel electrode is divided into two sub-pixel electrodes from one side of the pixel electrode. The first sub-pixel electrode is located near one lateral side of the opening area, and the second sub-pixel electrode is located near the other lateral side of the opening area. A boundary line between the first sub-pixel electrode and the second sub-pixel electrode is at least one of a straight line, a curved line, and a polyline.

In FIG. 6B and FIG. 6C, the pixel electrode is divided into two sub-pixel electrodes from the center of the pixel electrode. One of the first sub-pixel electrode and the second sub-pixel electrode is located in the middle of the opening area, and the other is disposed around the middle of the opening area, which are the sub-pixel area located in the center and another sub-pixel area around the sub-pixel area. As shown in FIG. 6B and FIG. 6C, a shape of the sub-pixel electrode in the middle of the opening area is at least one of a circle, a rectangle, a triangle, and a diamond. However, the above description is only exemplary, and the present disclosure is not limited thereto. Methods to divide the pixel electrode may vary based on the actual requirements, and the shape of the divided sub-pixel electrode may also be various based the requirements.

In the embodiment of the present disclosure, the pixel electrode is divided into two sub-pixel electrodes and combined with the time-sharing driving method, so that the organic light emitting materials in the two sub-pixel areas optionally emit light for different conditions of normal brightness display and low brightness display, thereby avoiding the problem of uneven brightness caused by the use of small current and the problem of screen flickers caused by time-sharing driving. Therefore, the display device according to the embodiment of the present disclosure may improve the problems of uneven brightness and screen flickers, thereby enhancing display quality.

The description above are only the preferred embodiments of the present disclosure. It should be noted that for those ordinarily skilled in the art, without departing from the principle of the present disclosure, several improvements and modifications may be made, and these improvements and modifications should also be considered the claimed scope of the present disclosure.

What is claimed is:

1. An organic light emitting diode (OLED) display panel, comprising a plurality of sub-pixels arranged in an array and a plurality of pixel drive circuits for driving the sub-pixels, wherein each of at least one of the pixel drive circuits comprises:
    a reset module configured to reset a potential at a first point under control of a first scan signal;
    a data signal input module connected to the reset module through the first point, and configured to input a data signal to the first point under control of a second scan signal;
    a storage module connected to the data signal input module through the first point, connected to a first power potential signal line through a second point, and configured to store a voltage of the data signal;
    a light emitting device comprising a first light emitting device and a second light emitting device;
    a drive module, wherein a first input end of the drive module is connected to the first power potential signal line, a second input end of the drive module is connected to the first point, and a third input end of the drive module is connected to the data signal input module through a third point, a fourth input end of the drive module is connected to the data signal input module through a fourth point, and an output end of the drive module is connected to both the first light emitting device and the second light emitting device, and is configured to drive the first light emitting device and the second light emitting device to emit light in a first display stage under control of a first light emitting control signal, a second light emitting control signal, and a first point potential, and to drive the first light emitting device to emit light, but not to drive the second light emitting device to emit light in a second display stage,
    wherein the OLED display panel comprises:
        a substrate;
        a pixel electrode layer formed on an upper surface of the substrate, and patterned to form a plurality of pixel electrodes;
        a pixel definition layer formed on a side of the pixel electrode layer away from the substrate, and patterned to form a plurality of opening areas, wherein the opening areas have one-to-one correspondence to the pixel electrodes,
    wherein in each of at least one of the opening areas, the pixel electrode comprises a first sub-pixel electrode and a second sub-pixel electrode that are not in contact with each other.

2. The OLED display panel according to claim 1, wherein the reset module comprises a first transistor, a gate of the first transistor is connected to the first scan signal, a first electrode of the first transistor is connected to an initialization voltage line, and a second electrode of the first transistor is connected to the first point.

3. The OLED display panel according to claim 2, wherein the data signal input module comprises a second transistor and a third transistor, a gate of the second transistor and a gate of the third transistor are connected to the second scan signal, a first electrode of the second transistor is connected to the data signal, a second electrode of the second transistor is connected to the drive module through the third point, a first electrode of the third transistor is connected to the drive module through the fourth point, and a second electrode of the third transistor is connected to the first point.

4. The OLED display panel according to claim 3, wherein the storage module comprises a storage capacitor, a first plate of the storage capacitor is connected to the first point, and a second plate of the storage capacitor is connected to the first power potential signal line.

5. The OLED display panel according to claim 4, wherein the drive module comprises a fourth transistor, a fifth transistor, a sixth transistor, and a seventh transistor, a gate of the fourth transistor is connected to the first light emitting control signal, and a first electrode of the fourth transistor is connected to the first power potential signal line, a second electrode of the fourth transistor and a first electrode of the fifth transistor are connected to the third point, a gate of the fifth transistor is connected to the first point, a second electrode of the fifth transistor and a first electrode of the sixth transistor and a first electrode of the seventh transistor are connected to the fourth point, a gate of the sixth transistor is connected to the first light emitting control signal, a gate of the seventh transistor is connected to the second light emitting control signal, a second electrode of the sixth transistor is connected to the first light emitting device, and a second electrode of the seventh transistor is connected to the second light emitting device.

6. The OLED display panel according to claim 5, wherein a common electrode of the first light emitting device and a common electrode of the second light emitting device are connected to a second power potential signal line different from the first power potential signal line, a first sub-pixel electrode of the first light emitting device is connected to the second electrode of the sixth transistor, and a second sub-pixel electrode of the second light emitting device is connected to the second electrode of the seventh transistor.

7. The OLED display panel according to claim 6, wherein the light emitting device is an organic light emitting diode.

8. The OLED display panel according to claim 7, wherein the OLED display panel further comprises:
a transistor layer formed between the substrate and the pixel electrode layer and corresponding to at least one of the sub-pixels, wherein the transistor layer comprises the sixth transistor and the seventh transistor;
a light emitting layer formed in each of the opening areas;
a common electrode layer formed on one side of the light emitting layer away from the pixel electrode layer;
wherein the first sub-pixel electrode and the second sub-pixel electrode are respectively connected to the sixth transistor and the seventh transistor.

9. The OLED display panel according to claim 8, wherein in a direction away from the substrate, the transistor layer comprises an active layer, a first gate insulation layer, a first metal layer, a second gate insulation layer, a second metal layer, an interlayer dielectric layer, a source-drain layer, and a planarization layer, wherein the active layer is patterned to form a first active layer of the sixth transistor and a second active layer of the seventh transistor, the first metal layer is patterned to form the gate of the sixth transistor and the gate of the seventh transistor, the source-drain layer is patterned to form the first electrode and the second electrode of the sixth transistor and the first electrode and the second electrode of the seventh transistor, wherein the second electrode of the sixth transistor is connected to the first sub-pixel electrode, and the second electrode of the seventh transistor is connected to the second sub-pixel electrode.

10. The OLED display panel according to claim 9, wherein a first doped area of the first active layer and a first doped area of the second active layer are connected to each other to form a co-doped area, the first electrode of the sixth transistor and the first electrode of the seventh transistor are connected to each other to form a common electrode, the second electrode of the sixth transistor is connected to a second doped area of the first active layer, the second electrode of the seventh transistor is connected to a second doped area of the second active layer, and the common electrode is connected to the co-doped area.

11. The OLED display panel according to claim 8, wherein one of the first sub-pixel electrode and the second sub-pixel electrode is located in the middle of the opening area, and the other one is disposed around the middle of the opening area.

12. The OLED display panel according to claim 11, wherein a shape of the sub-pixel electrode in the middle of the opening area is at least one of a circle, a rectangle, a triangle, and a diamond.

13. The OLED display panel according to claim 8, wherein the first sub-pixel electrode is located at a side of the opening area, and the second sub-pixel electrode is located at other side of the opening area opposite to the side of the opening area.

14. The OLED display panel according to claim 13, wherein a boundary line between the first sub-pixel electrode and the second sub-pixel electrode is a straight line.

15. The OLED display panel according to claim 9, wherein a gap between the first sub-pixel electrode and the second sub-pixel electrode is filled with the same material as the planarization layer or the interlayer dielectric layer.

16. A display device, comprising an OLED display panel and a drive chip, wherein the OLED display panel comprises a plurality of sub-pixels arranged in an array and a plurality of pixel drive circuits for driving the sub-pixels, wherein each of at least one of the pixel drive circuits comprises:
a reset module configured to reset a potential at a first point under control of a first scan signal;
a data signal input module connected to the reset module through the first point, and configured to input a data signal to the first point under control of a second scan signal;
a storage module connected to the data signal input module through the first point, connected to a first power potential signal line through a second point, and configured to store a voltage of the data signal;
a light emitting device comprising a first light emitting device and a second light emitting device;
a drive module, wherein a first input end of the drive module is connected to the first power potential signal line, a second input end of the drive module is connected to the first point, and a third input end of the drive module is connected to the data signal input module through a third point, a fourth input end of the drive module is connected to the data signal input module through a fourth point, and an output end of the drive module is connected to both the first light emitting device and the second light emitting device, and is configured to drive the first light emitting device and the second light emitting device to emit light in a first display stage under control of a first light emitting control signal, a second light emitting control signal, and a first point potential, and to drive the first light emitting device to emit light, but not to drive the second light emitting device to emit light in a second display stage,
wherein the OLED display panel comprises:
a substrate;
a pixel electrode layer formed on an upper surface of the substrate, and patterned to form a plurality of pixel electrodes;
a pixel definition layer formed on a side of the pixel electrode layer away from the substrate, and patterned to form a plurality of opening areas, wherein the opening areas have one-to-one correspondence to the pixel electrodes,
wherein in each of at least one of the opening areas, the pixel electrode comprises a first sub-pixel electrode and a second sub-pixel electrode that are not in contact with each other.

17. The display device according to claim 16, wherein the OLED display panel further comprises:
a transistor layer formed between the substrate and the pixel electrode layer and corresponding to at least one of the sub-pixels, wherein the transistor layer comprises the sixth transistor and the seventh transistor;
a light emitting layer formed in each of the opening areas;
a common electrode layer formed on one side of the light emitting layer away from the pixel electrode layer;
wherein the first sub-pixel electrode and the second sub-pixel electrode are respectively connected to the sixth transistor and the seventh transistor.

18. The display device according to claim 17, wherein one of the first sub-pixel electrode and the second sub-pixel electrode is located in the middle of the opening area, and the other one is disposed around the middle of the opening area.

19. The display device according to claim 18, wherein a shape of the sub-pixel electrode in the middle of the opening area is at least one of a circle, a rectangle, a triangle, and a diamond.

20. The display device according to claim 17, wherein the first sub-pixel electrode is located at a side of the opening area, and the second sub-pixel electrode is located at other side of the opening area opposite to the side of the opening area.

* * * * *